United States Patent [19]
Chevalier et al.

[11] Patent Number: 5,001,491
[45] Date of Patent: Mar. 19, 1991

[54] LOW-POWER CUT-OFFF DEVICE FOR DIODE PHASE SHIFTERS

[75] Inventors: Michel Chevalier; Roger Bischoff; Yves Loiseau, all of Paris, France

[73] Assignee: Thomson-CSF, Paris, France

[21] Appl. No.: 769,892

[22] Filed: Feb. 15, 1977

[51] Int. Cl.[5] .................. H01Q 3/22; H01Q 3/24; H01Q 3/26
[52] U.S. Cl. .................................................. 342/372
[58] Field of Search .................. 343/100 SA, 854; 328/155; 323/101, 106; 342/372

[56] References Cited

U.S. PATENT DOCUMENTS

| | | | |
|---|---|---|---|
| 3,710,145 | 1/1973 | Williamson et al. | 343/100 SA |
| 3,720,888 | 3/1973 | Manuali | 343/854 |
| 3,795,826 | 3/1974 | Adey | 307/270 |
| 3,949,407 | 4/1976 | Jagdmann et al. | 343/854 |

Primary Examiner—Theodore M. Blum
Attorney, Agent, or Firm—Herbert Dubno; Ronald Lianides

[57] ABSTRACT

A diode phase-shifting device for an electronically scanning antenna includes a cut-off device designed to operate when the phase-shifting diodes are switched to their non-conducting state, with a view to increasing the switchover speed. This device comprises mainly a low-voltage generator, a circuit breaker or switch, and a high-voltage generator. A switching from the low-voltage generator to the high-voltage generator occurs when the voltage at the terminals of the phase-shifting diode considered exceeds a given threshold value.

6 Claims, 1 Drawing Sheet

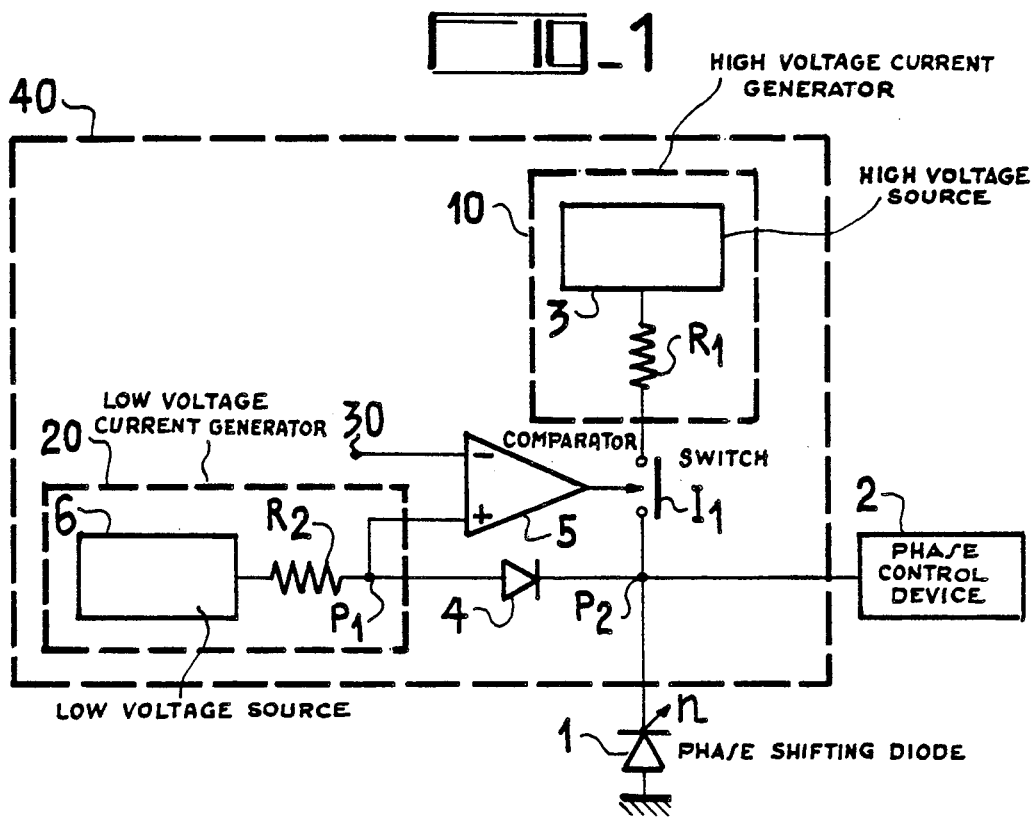
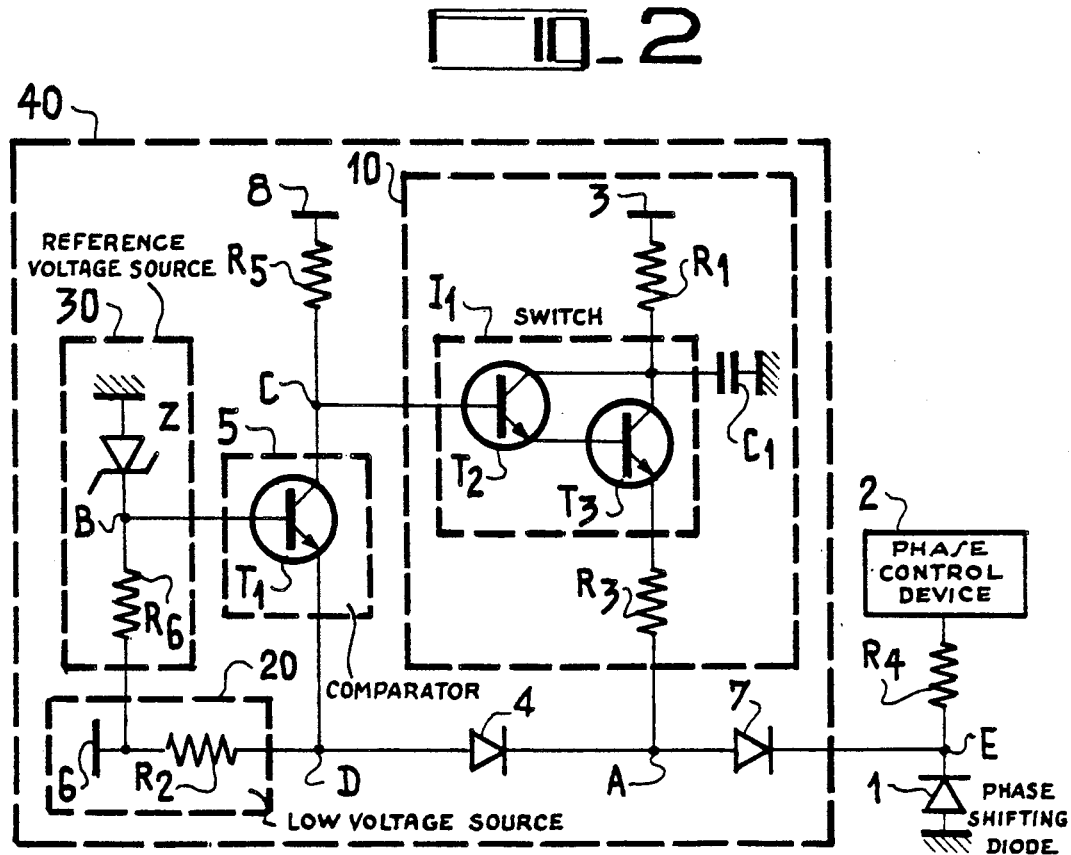

LOW-POWER CUT-OFFF DEVICE FOR DIODE PHASE SHIFTERS

FIELD OF THE INVENTION

The present invention relates to phase-shifting diode array for an electronically scanning antenna and, more particularly, to a low-power cut-off device serving to quench one or more diodes of such an array upon switchover from their conducting to their non-conducting state.

BACKGROUND OF THE INVENTION

Electronically scanning antennas comprise a primary source and a network of phase shifters associated with radiating means. Each phase shifter of the type here considered is formed by a microwave line coupled to conventional PIN diodes which, as a function of their conducting or non-conducting state, enable reactances to be introduced which vary the phase angle. The switching from the non-conducting to the conducting state of the dephasing diodes occurs quickly enough. On the other hand, the reverse switching from the conducting to the non-conducting state does not occur instantaneously. At the instant of switching, each diode begins to act as a short-circuit in which a significant reverse current flows before the diode actually cuts off. At the instant, when the polarity of the voltage applied to the junction of each PIN diode is reversed, the current in the diode decreases rapidly and then reverses suddenly. This current is due to the movement of the minority carriers which had previously been accumulated during the period of forward conduction at the junction level.

The charges stored are a function of the lifetime of the minority carriers and of the forward current before switching. The sweep-out of these charges is ensured by quenching or cut-off means which provide a reverse current that produces the elimination of the charge carriers. The quenching operation must be done quickly so that the time required for switching is as short as possible. This condition is indispensable if it is desired to use the phase shifter mentioned above for the antennas of short-range and hence high-repetition-rate radars or for antennas of long-range radars in which it is useful to be able to change the aim of the antenna during a repetition period.

However, the speed of the change of beam orientation is a function of the speed of switching of the dephasing diodes which is in turn related to the intensity of the current supplied by the cut-off means employed.

In accordance with known practice, the means designed to deliver a reverse current as soon as it is desired to cut off the diodes include a high-voltage source combined with a high resistance. The high-voltage supply, which is bulky, operates at high power and with considerable thermal dissipation. As a result, there are large temperature variations in the diode cut-off device and the minority carriers in the dephasing diodes, which have a life that increases with temperature, are eliminated slowly and hence slow down the switching.

OBJECT OF THE INVENTION

The object of our present invention is to provide a quenching device for a PIN diode which does not have the disadvantages cited above and is free of the limitations indicated.

SUMMARY OF THE INVENTION

We realize this object, in accordance with our present invention, by the provision of two direct-current sources having a polarity such as to reverse-bias a given phase-shifting diode whose cutoff is to be accelerated, i.e. a low-voltage source and a high-voltage source. The low-voltage source is connected to a junction of a conventional phase-control device with an electrode of the phase-shifting diode, specifically its cathode in the embodiment described hereinafter, while the high-voltage source is connectable to that junction by switchover means responsive to an output signal emitted by a comparison circuit whenever the phase-shifting diode is reverse-charged by the low-voltage source to a level matching a predetermined reference potential. When thus connected to the phase-shifting diode by the switchover means, the high-voltage source overrides the low-voltage source in applying a reverse charge to that diode.

The comparison circuit, pursuant to a more particular feature of our invention, may comprise a transistor having a collector connected through a resistor to a source of potential higher than that of the low-voltage source, a base connected to the supply of reference potential, and an emitter connected to the aforementioned junction via an ancillary diode inserted between that junction and the low-voltage source in bucking relationship with the phase-shifting diode. The switchover means may comprise a Darlington transistor pair with a first transistor stage having a base connected to the collector of the comparison transistor and with a second transistor stage having a collector/emitter circuit inserted between the aforementioned junction and the high-voltage source.

BRIEF DESCRIPTION OF THE DRAWING

The above and other features of our invention will be described in greater detail with reference to the accompanying drawing in which:

FIG. 1 is a diagrammatic view of a cut-off device for a dephasing diode; and

FIG. 2 is a detailed diagram of the cut-off device.

SPECIFIC DESCRIPTION

The system shown in FIG. 1 comprises a rapid-quenching device 40, associated with a dephasing diode 1 of the PIN type, which starts automatically when the conduction-blocking command for diode 1 is given by a phase-control device 2. The quenching device contains a high-voltage current generator 10 formed by a high-voltage source 3 in series with a resistor $R_1$ which is connected through a switch $I_1$ to the cathode of diode 1 whose anode is grounded. It also includes a low-voltage current generator 20 with a low-voltage source 6 in series with a resistor $R_2$ which is connected at $P_2$ to an input of a comparator 5 whose other input is connected to a reference-voltage source 30 that controls the closing of switch $I_1$.

The rapid-quenching device operates only when all the control modules are cut off; the phase changes required for any reorientation of the antenna may involve, for example, the cutting off of all the dephasing devices, such as diode 1, followed by conduction of only those diodes which are required to adjust the antenna to its new aiming direction.

This requires the quenching device 40 to be started after a forced-cutoff instruction supplied by phase-control device 2 during the reorientation of the antenna. The forced-cutoff instruction acting on the conducting diode 1 causes it to change to the cut-off state. When this switchover occurs, diode 1, now traversed by a reverse current resulting from the movement of minority carriers that were previously stored during the conducting period, has a relatively low impedance. At the start of the switchover, switch $I_1$ is kept open. Low-voltage generator 20, through source 6, low-ohmic resistor $R_2$ and diode 4, supplies a high current effective to cause the evacuation of the minority charges in diode 1.

The positive potential at point $P_1$, and hence also at point $P_2$ connected to the cathode of diode 1, increases. At the end of the evacuation of the minority carriers performed by low-voltage generator 6, the potential at $P_1$ is such that, upon comparing it with reference voltage 30, comparator 5, acting on switch $I_1$, commands the connection of high-voltage generator 3 to diode 1 which is now no longer fed by source 6. In fact, the high-voltage generator supplies a current which charges the parasitic capacitance of diode 1; this causes a quick voltage rise in the diode almost to its maximum reverse voltage. Diode 4 is also cut off to disconnect the low-voltage generator from diode 1.

The forced-cutoff instruction can then disappear. Normal control is re-established and, depending on the circumstances, it confirms the cutoff or causes the diode 1 to conduct. In the case of normal cutoff, high-voltage generator 3 cannot supply an output and diode 1 remains nonconductive; the quenching device is no longer operating. When the diode is conducting, high-voltage current generator 3 is cut off by comparator 5.

FIG. 2 shows in more detailed fashion the circuitry of the quenching device 40 illustrated in FIG. 1.

The source 3, which may supply a voltage on the order of 150 V, for example, is connected through resistor $R_1$ to the collector of a transistor $T_3$ of the PNP type coupled to a transistor $T_2$ also of the PNP type. The two transistors $T_2$ and $T_3$ form a Darlington assembly which, in operation, acts as a single transistor whose input impedance is high. The collectors of transistors $T_2$ and $T_3$ are connected to ground through a capacitor $C_1$. The emitter of transistor $T_3$ is connected through a low-ohmic load resistor $R_3$, e.g. on the order of 10 kohms, to a junction A of the cathode of diode 4 with the anode of another diode 7 whose cathode is connected at E to diode 1. High-voltage current generator 10 is connected through the reverse resistance of diode 4 to low-voltage current generator 20 whose voltage source 6, giving about 5 volts in the example described, feeds the low-ohmic resistor $R_2$ on the order of 1 kohm. The two ancillary diodes 4 and 7 are both connected in bucking relationship with the phase-shifting diode 1.

Low-voltage current generator 20 is connected at D to the emitter of an NPN transistor $T_1$ which forms the comparator element 5. The collector of transistor $T_1$ is connected at C to a high-voltage source 8 through a high-ohmic resistor $R_5$ on the one hand, and to the base of transistor $T_2$, on the other hand. The base of transistor $T_1$ is connected at B to reference-voltage source 30 here formed by a Zener diode Z whose anode is connected to ground and whose cathode is connected to source 6 via a resistor $R_6$.

When the diode 1 is cut off in response to an instruction coming from phase controller 2, i.e. a negative voltage applied to its cathode via a resistor $R_4$, it acts as a short-circuit and, because of that, appears as a fairly low impedance. Low-voltage current generator 20 supplies through low-ohmic resistor $R_2$ a high reverse current to diode 1 which eliminates the minority carries. The energy consumption at this stage is not very high. The positive voltage at points E, A and D rises and transistor $T_1$ is held open as long as the difference in potential between points B and D is greater than or equal to 0.6 V. At this specific instant, transistor $T_1$ cuts off and causes the potential at point C to rise to that of high-voltage source 8, which is on the order of 150 V in the example described.

Transistors $T_2$ and $T_3$, which were cut off till then, conduct again. The voltage at the terminals of resistor $R_1$ being on the order of 150 V in the example described, diode 4 is cut off and low-voltage generator 20 ceases to energize the diode 1 which no longer acts as a short-circuit. Thus, generator 10 supplies the current which charges the parasitic capacitance of dephasing diode 1, causing a quick rise of the voltage thereacross to its reverse-voltage limit.

By way of example, the switchover period may last 30 $\mu s$.

The low-voltage current generator 20 may be effective for 10 $\mu s$. During the next 20 $\mu s$, its output is replaced by that of high-voltage current generator 10.

In the case where the antenna system contains n=2000 2-bit dephasing units, each dephasing unit being fitted with 3 diodes and each quick-charging device being associated with two dephasing units, it may be noted that n/2=1000 quenching devices may serve these dephasing units.

With a minimum of components, our improved diode-quenching device enables a high current, which ensures quick switching, to be supplied to a dephasing diode. It further enables the action of the high-voltage current generator to be delayed until the minority carriers are eliminated by the action of the low-voltage current generator. It also makes possible a reduction of 3 to 5 times in the power of the high-voltage supply.

What is claimed is:

1. In an electronic scanning system for an antenna provided with an array of phase-shifting diodes and phase-control means for alternately rendering each phase-shifting diode conducting and nonconducting, the combination therewith of a quenching device for accelerating the cutoff of a given phase-shifting diode comprising:

a low-voltage source of direct current connected to a junction of said phase-control means with an electrode of an associated phase-shifting diode, said low-voltage source having a polarity reverse-biasing said phase-shifting diode;

a high-voltage source of direct current having the same polarity as said low-voltage source;

a supply of reference potential;

comparison means with inputs connected to said supply and to said junction for generating an output signal upon a reverse-charging of said phase-shifting diode by said low-voltage source to a level matching said reference potential; and switchover means connected to said comparison means for connecting said high-voltage source to said junction in response to said output signal, thereby overriding said low-voltage source in applying a reverse charge to said phase-shifting diode.

2. The combination defined in claim 1 wherein said electrode is a cathode, said phase-shifting diode being provided with a grounded anode, the polarities of said low-voltage source, said high-voltage source and said reference potential being positive.

3. The combination defined in claim 1, further comprising at least one ancillary diode inserted between said low-voltage source and said junction in bucking relationship with said phase-shifting diode.

4. The combination defined in claim 3 wherein said comparison means comprises a transistor having a collector connected through a resistor to a source of potential higher than that of said low-voltage source, a base connected to said supply of reference potential, and an emitter connected to said junction by way of said ancillary diode.

5. The combination defined in claim 4 wherein said supply of reference potential comprises a voltage divider connected between said low-voltage source and a point of higher potential, said voltage divider including a Zener diode in series with a resistor, said base being connected to a terminal of said Zener diode.

6. The combination defined in claim 4 wherein said switchover means comprises a first and a second transistor stage interconnected in a Darlington configuration, said first transistor stage having a base connected to said collector, said second transistor stage having a collector/emitter circuit inserted between said high-voltage source and said junction.

* * * * *